United States Patent [19]
Prentice

[11] Patent Number: 5,504,449
[45] Date of Patent: Apr. 2, 1996

[54] POWER DRIVER CIRCUIT

[75] Inventor: John S. Prentice, Palm Bay, Fla.

[73] Assignee: Harris Corporation, Melbourne, Fla.

[21] Appl. No.: 865,868

[22] Filed: Apr. 9, 1992

[51] Int. Cl.$^6$ .................... H03K 17/687; H03K 17/72; H03K 3/00
[52] U.S. Cl. .................... 327/427; 327/428; 327/443; 327/445; 327/108; 327/582
[58] Field of Search .................... 307/270, 570, 307/571, 573, 574, 577, 630, 631, 632, 633, 246

[56] References Cited

U.S. PATENT DOCUMENTS

| | | | |
|---|---|---|---|
| 3,891,866 | 6/1975 | Okuhara et al. | 327/427 |
| 4,492,883 | 1/1985 | Janutka | 307/246 |
| 4,694,206 | 9/1987 | Weinberg | 307/246 |
| 4,912,335 | 3/1990 | Ehalt et al. | 250/551 |
| 4,979,011 | 12/1990 | Prentice | 357/38 |
| 4,992,683 | 2/1991 | Robin, Jr. | 307/270 |
| 5,045,709 | 9/1991 | Ogawa | 250/511 |
| 5,086,242 | 2/1992 | Heilman et al. | 307/631 |

FOREIGN PATENT DOCUMENTS

| | | |
|---|---|---|
| 100020 | 5/1986 | Japan. |
| 172812 | 7/1987 | Japan. |
| 208317 | 8/1988 | Japan. |
| 1054925 | 3/1989 | Japan. |

OTHER PUBLICATIONS

Prentice et al, "High Frequency, Low Cost Gate Drive Integrated Circuit", Technical Papers of the Sixth International High Frequency Power Conversion Conference, Jun. 9–14, 1991, Toronto, Ontario, Canada, pp. 1–9.

*Primary Examiner*—Timothy P. Callahan
*Assistant Examiner*—Trong Phan
*Attorney, Agent, or Firm*—Rogers & Killeen

[57] ABSTRACT

A power driver circuit for turning a semiconductor switching device on and off in response to receipt of a control signal includes a trigger circuit that turns on a latching switch at a speed that is independent of the rate of change of the control signal. The trigger circuit is responsive to the control signal to apply a current from the semiconductor switching device to the latching switch. A high speed SCR may be used as the latching switch and may be triggered by a small trigger current from the gate of the semiconductor switching device fed to both the anode and cathode gates of the SCR. High speed diodes may also be used to increase the speed of the circuit. The power driver circuit improves the efficiency of the semiconductor switching device by decreasing the time the switching device spends in transition its two steady states.

14 Claims, 8 Drawing Sheets

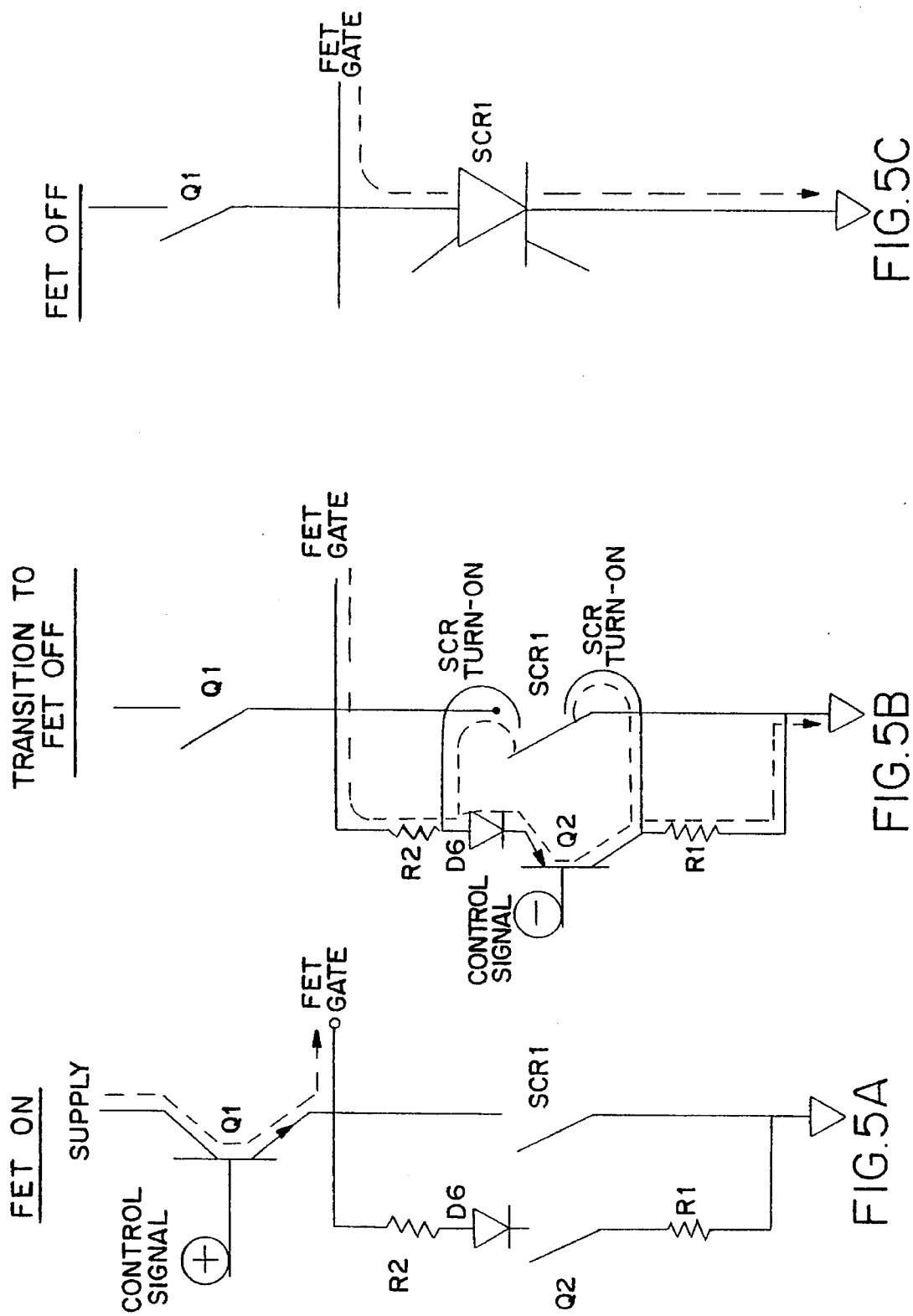

POWER DRIVER CIRCUIT

BACKGROUND OF THE INVENTION

The present invention relates to power driver circuits for controlling the operation of a semiconductor switching device in response to control signal inputs from a control circuit. In one aspect, the present invention relates to a method and device for turning on a latching switch in the power driver circuit at a speed that is independent of the rate of change of the control signal input voltage. In another aspect, the present invention is responsive to the control signal to control the operation of the latching switch by the semiconductor switching device.

It is to be understood that the terms used to describe elements of various embodiments of the present invention are not intended to limit the invention to those particular named elements where a functional equivalent exists. For example, even though the term "MOSFET" is used in the following description to describe the semiconductor switching device, the present invention also relates to other semiconductor switching devices such as FETs, IGBTs MOS controlled thyristors, (MCT's), BJTs, triacs, SCRs, GTO thyristors, and SITs. The gate of the MOSFET has equivalent structures in these devices and reference to a gate herein includes the equivalent structure in these devices. Further, by way of example, the term "SCR" as used in the following description also refers to other latching switches as are known in the art.

Semiconductor switching devices typically are used to regulate power that is to be switched on and off at a frequency determined by a control circuit. A power driver circuit typically acts as a buffer between the control circuit and the switching device and translates control signals from the control circuit into signals that can turn the switching device on and off at the requisite frequency. For example, a switchmode power supply (a semiconductor switching device) may be operated by a pulse transformer (a control circuit) at 300 kHz through a power driver circuit.

As is known, semiconductor switching devices consume more power during the period of transition between its two on and off steady states than during either the on or off periods. Therefore, one way to improve the efficiency of a switching device operating at a particular frequency is to decrease the length of the periods in which the switching device is in transition.

The background of the present invention may be further understood with reference to FIG. 1, in which a power driver circuit of the prior art may be seen. A FET 10 may be driven by a control circuit 12 through a power driver circuit 14. To turn the FET 10 on, current is provided to the gate 16 of the FET thereby allowing the FET to conduct a current between its source 18 and drain 20. To turn the FET off and stop current flow between its source and drain, current is pulled from the gate 16.

The control signal is applied through D1 to charge C1 in one cycle and the FET is turned on when a control signal from control circuit 12 in a second cycle is routed through D2 and D3 to the base of BJT Q1, turning Q1 on. When Q1 is on, current from C1 is applied to the gate 16 to turn on the FET.

The FET is turned off when the current at gate 16 is drained through a latching switch 22 (the latching switch in FIG. 1 is formed by the combination of BJTs Q2 and Q3). The current from the FET gate 16 is drained when latching switch 22 is turned on, with latching switch 22 being turned on when the voltage across R2 is Q1 $V_{BE}$ below the gate voltage of the FET. In other words, R2 provides a trigger current for turning on the latching switch 22.

The rate at which the FET turns off, and thus the length of the period of transition, is controlled by the speed at which the charge on the gate 16 is drained. The speed at which the charge is drained from the gate 16 is, in turn, controlled by the speed at which latching switch 22 turns on.

Typically, a latching switch, such as an SCR, must build up a charge before turning on. The trigger of the prior art (R2) which controls conduction of the latching switch derives current from the control signal, and thus the speed at which the latching switch conducts is a function of the character in the control signal.

In contrast, the latching switch of the present invention is independent of the character of the control signal.

More specifically, the latching switch that controls the turn off rate of the FET is turned on immediately following a change in polarity of the control signal by drawing a small portion of the current from the FET as a trigger current to both the anode gate and the cathode gate of the latching switch.

In contrast to the known prior art which provides a triggering signal to only one side of the latching switch, triggering signals are provided to both sides of the latching switch to speed its conditioning for conduction.

This distinction may be more clearly seen with reference to FIGS. 2 and 3 where the present invention (FIG. 2) uses a trigger signal from the FET gate to turn on latching switch 2 in contrast to the prior art (FIG. 3), where the switch 2 is turned on by the control signal.

With reference to FIG. 3, power from the control circuit (possibly by way of capacitor C1 of FIG. 1) is applied through Switch 1 to the gate of the FET. Conduction (or turn on) of the FET is thus achieved by the application of a control signal from the control circuit to the control terminal of Switch 1, and the application of a control signal to the trigger switch which insures non-conduction of the Switch 2 which permits the accumulation of charge on the FET gate.

The turn off of the FET is achieved by reversal of the conduction states of Switch 1 and Switch 2 under the control of the control circuit, Switch 1 opening to remove power to the FET gate and Switch 2 closing to drain the charge from the FET gate. However, the trigger switch is not immediately responsive to the reversal of the polarity of the control signal and depends on its amplitude. Thus the initiation of FET turn off is a function of the character of the control signal and lags the polarity reversal.

As shown in FIG. 2, the turn on of the FET is achieved in the same manner as described above in connection with FIG. 3. However, turn off is accelerated because the trigger switch in FIG. 2 is immediately responsive to the polarity reversal of the control circuit without regard to its amplitude to apply a trigger signal from the gate of the FET to Switch 2, thereby immediately initiating conduction of Switch 2. Turn off of the FET is thus independent of the character of the control signal.

Accordingly, it is an object of the present invention to provide a novel method and device for improving the efficiency of semiconductor switching devices.

It is a further object of the present invention to provide a novel method and device for providing triggering a latching switch in a power driver circuit.

It is yet a further object of the present invention to provide a novel method and device in which current from the semiconductor switching device gate is used to initiate operation of a latching switch in a power driver circuit.

It is still a further object of the present invention to provide a novel method and device for decreasing the length of the periods of transition between the two steady states of a semiconductor switching device.

It is another object of the present invention to provide a novel power driver circuit in which a high speed diode and a high speed SCR contribute to decreasing the length of the period of transition between the two steady states of a semiconductor switching device.

These and many other objects and advantages of the present invention will be readily apparent to one skilled in the art to which the invention pertains from a perusal of the claims, the appended drawings and the following detailed description of preferred embodiments.

DESCRIPTION OF THE DRAWINGS

FIGS. 5A–C schematically illustrate the sequence of operation of the circuit of the present invention.

DESCRIPTION OF PREFERRED EMBODIMENTS

With reference now to the figures in which various embodiments of the power driver circuit of the present invention are illustrated, the various pin numbers depicted therein refer to connection pins that are found in a chip embodying the present invention and it is to be understood that the invention is not limited to this pin arrangement.

Figure 1:
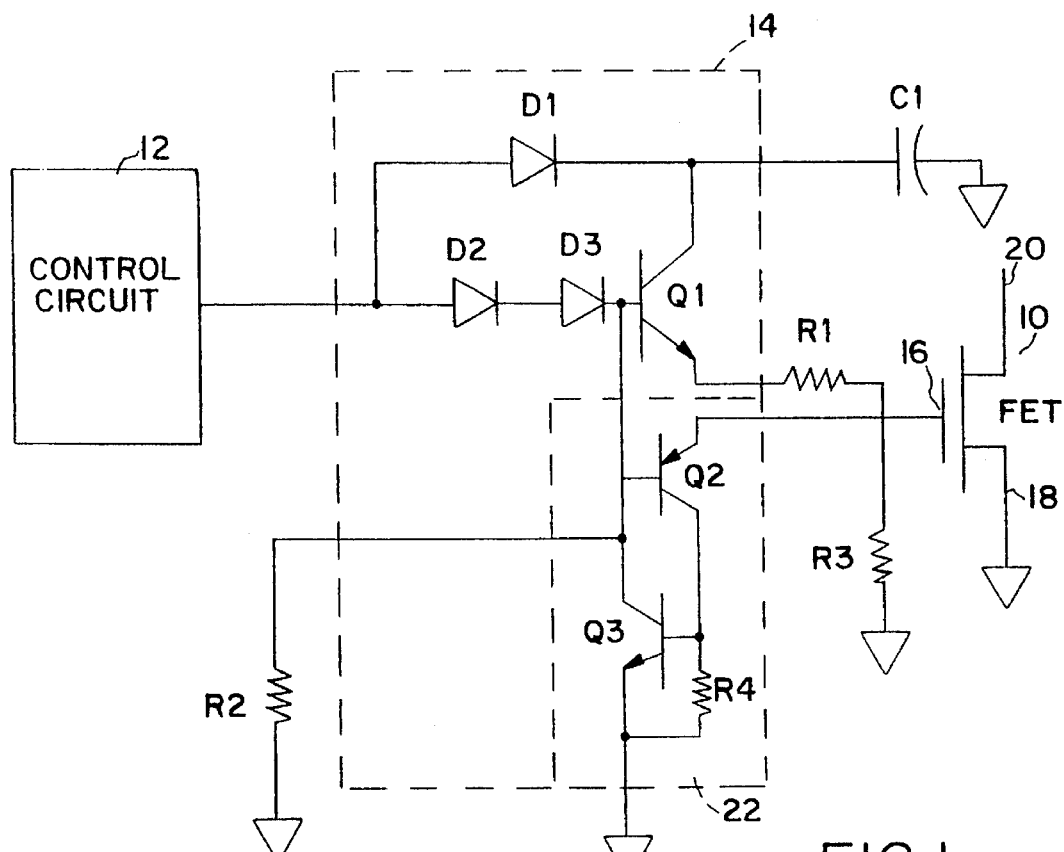
FIG. 1 is a schematic circuit diagram of a power driver circuit of the prior art.
Figure 4:
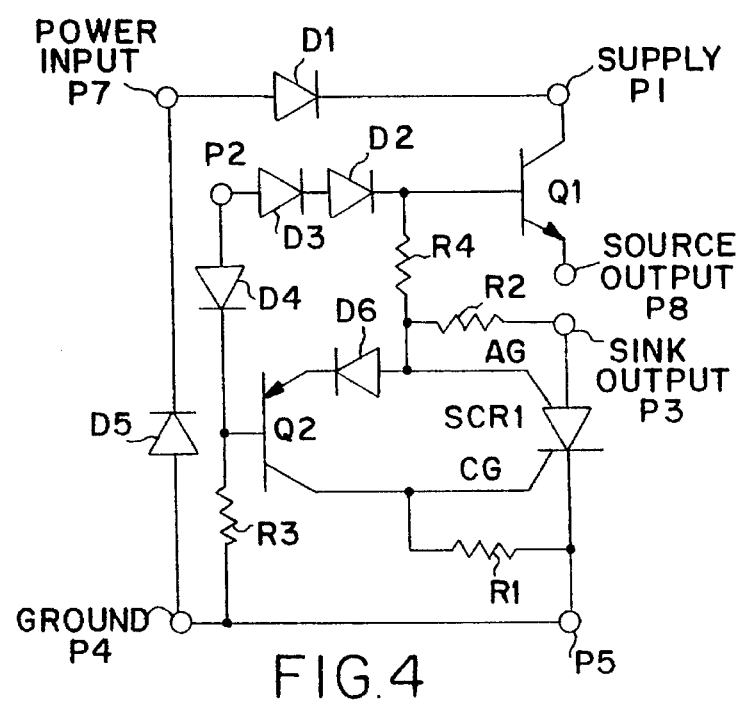
FIG. 4 is a schematic circuit diagram of one embodiment of the power driver circuit of the present invention.
Figure 3:
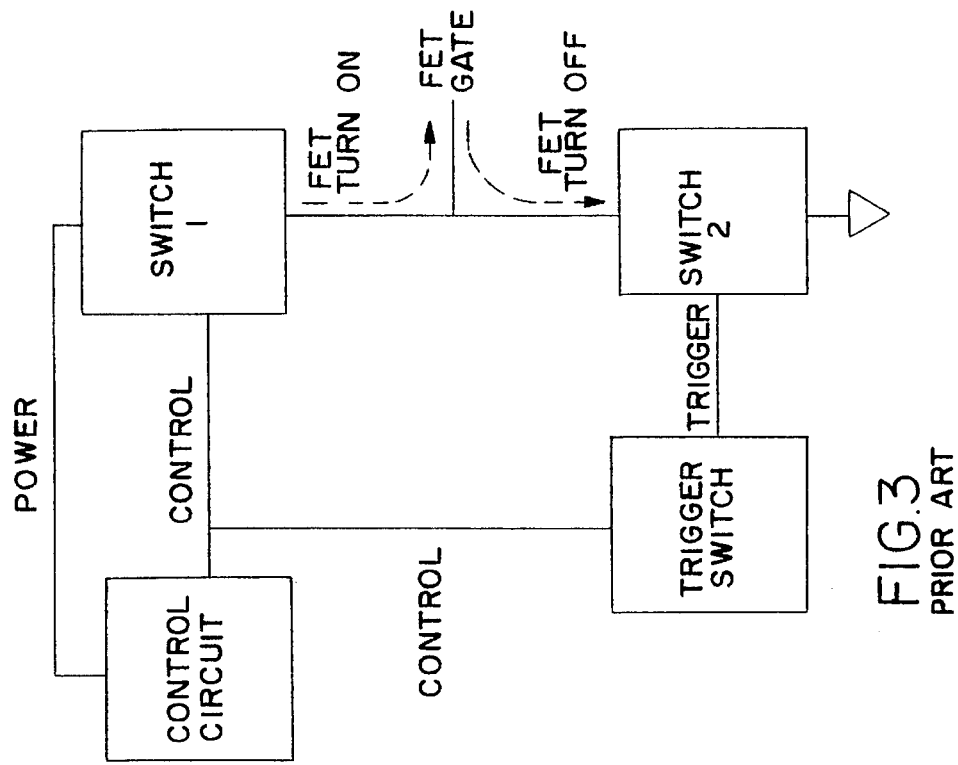
FIG. 3 is functional block diagram of the operation of the power driver circuit of the prior art as illustrated in FIG. 1.
Figure 2:
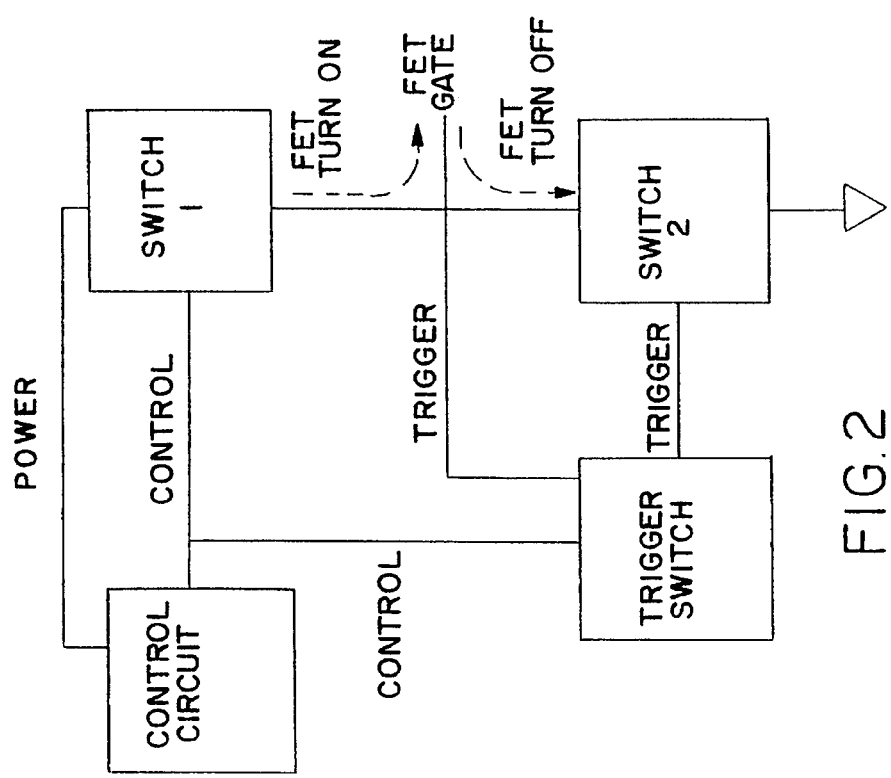
FIG. 2 is functional block diagram of the operation of the power driver circuit of the present invention.

With reference now to FIG. 4, the circuit of the present invention may include supply pin P1 and ground pins P4 and P5, which are considered the reference terminals. A power input on pin P7 is connected to the supply pin P1 and the ground pin P4 by diodes D1 and D5 respectively. A control input pin P2 is connected to the control terminal of an output switch, which is illustrated as transistor Q1, by diodes D2 and D3. The collector-emitter current path of Q1 is connected between the supply pin P1 and a source output pin P8 and is desirably capable of sourcing at least 6 amperes of current.

The second output switch is illustrated as SCR1 having its anode connected to a sink output pin P3 and its cathode connected to the ground pin P5. Resistor R1 connects the cathode to the cathode gate CG of SCR1 and resistor R2 connects the anode to the anode gate AG of SCR1. A trigger circuit, which includes PNP transistor Q2, is connected across the anode gate AG and cathode gate CG. A diode D6 connects the emitter of Q2 to the anode gate AG. A diode D4 connects the base of Q2 to the control pin P2. A resistor R4 connects the base of Q1 to sink output pin P3 via resistor R2.

The power driver circuit of FIG. 4 provides separate outputs pin P8 and pin P3 for sourcing and sinking current respectively.

The SCR1 is used to sink large currents, desirably at least 10 amperes. When the input goes low on pin P2, resistor R3 provides base drive for Q2. Transistor Q2 triggers SCR1 at both the anode and cathode gates. This triggering sequence begins as soon as D4 becomes reverse biased. Thus, the triggering delay time is independent of the input fall time. Resistor R4 provides a base discharge path for Q1. Diode D6 increases the input hysteresis to reduce the chances that ringing at the input or output will trigger the SCR. Resistors R1 and R2 remove excess stored charge from the SCR and also helps prevent false triggering. Diode D5 clamps the input low voltage. A high input turns on Q1. Diodes D2 and D3, along with D1, prevent Q1 from saturating. Diode D1 also provides a means of passing charge from the input pin P7 to the supply pin P1.

The operation of the present invention may be more clearly seen with reference to FIGS. 5A–C in which the sequence of operation is illustrated. As seen in FIG. 5A, the FET is turned on when current is provided through transistor Q1 to the FET gate. Transistor Q1 is on when the control signal is positive. Transistor Q2 and SCR1 are not on. As seen now in FIG. 5B, when the control signal first goes negative, a small amount of trigger current is provided to both the anode gate and cathode gate of SCR1 from the FET gate to begin turning SCR1 on (i.e., by building up the charge in the SCR). Trigger current flow is through resistor R2, diode D6 and emitter-collector path of transistor Q2 which has been turned on by the change of polarity of the control signal. Finally, as seen in FIG. 5C, SCR1 is turned on and drains the charge from the FET gate.

One of the applications for the power driver circuit of FIG. 4 driver is with a push-pull driven pulse transformer. The circuit of the present invention may be seen connected to such a transformer in FIG. 6.

The pulse transformer T1 provides the control signal at pin P2 and the charge for the MOSFET gate at pin P7. The transformer primary is driven bidirectionally to provide core reset. Many pulse width modulation (PWM) circuits provide complimentary outputs so each end of the primary winding is alternately connected to the PWM chip supply or ground. This generates a bidirectional signal in the transformer. Capacitor $C_{IN}$ provides volt-second balancing for the transformer secondary by charging to the average output voltage. A similar capacitor is usually required in series with the transformer primary. These capacitors are usually sized such that their voltage changes a fraction of a volt over a cycle. They transfer charge equal to the MOSFET gate charge plus the product of the circuit input current times "on" time.

When the transformer output goes positive, the MOSFET gate is pulled up. Capacitor $C_s$ acts as the power supply providing the gate charge. It is sized to hold at least ten times the MOSFET gate charge so its voltage change over a cycle is a fraction of a volt. Resistor $R_{OUT}$ tailors the impedance matching between the transformer and the MOSFET. Its value is multiplied by the NPN current gain of Q1, typically 200, at the control input pin P2. Therefore, during the low-to-high transition, the transformer is lightly loaded minimizing signal timing delays due to leakage inductance. The resistor $R_{OUT}$ also damps oscillations that could inadvertently trigger the off SCR1.

After the MOSFET gate is brought high, charge is transferred from the transformer to the storage capacitors $C_s$ through the diode D1 connected between the power input pin P7 and the supply pin P1. This charge storage permits the MOSFET driver to source peak currents much larger than the maximum current rating of the PWM circuit driving the transformer primary.

When the transformer polarity reverses, the SCR1 is triggered on which rapidly discharges the MOSFET gate. The diode D5, connected to the power input pin P7, clamps the input P2 about 1 volt below the MOSFET source and provides a path for transformer core and $C_{IN}$ reset currents.

Operation for the first few cycles of start up is a little different. Since the MOSFET gate supply is initially discharged, the pulse transformer supplies current for the MOSFET gate and supply capacitor $C_s$ at the same time. This means that for the first cycle the MOSFET is not turned on as hard or as quickly as normal, but this is not usually problematic. However, as long as the gate is above 3V, the turn off function works the same. The MOSFET driver circuit draws no quiescent supply current so any charge on $C_s$ remains until the next low-to-high transition.

One significant advantage of this approach is that none of the MOSFET driver circuitry requires any precharging or quiescent supply current to begin operating. If precharging or start-up current was required, it would most likely have to be supplied from a high voltage DC supply. This would degrade the overall power supply efficiency or require some extra circuit and cost to disable the precharge supply once the main power supply began operation.

It is possible to set up a latch state that discharges the storage capacitor $C_s$. If a positive going control signal turning on Q1 occurs before the SCR1 has recovered, then both Q1 and SCR1 can be on. The resulting cross conducting current will discharge the storage capacitor $C_s$. Resistor $R_{OUT}$ limits the peak current to a safe value and the circuit will unlatch when either the capacitor is discharged or the control input is taken low. This latch will not occur if the low-to-high transition is approximately 1 µS after the previous high-to-low transition. This SCR recovery time limits the maximum frequency of operation.

Figure 6:
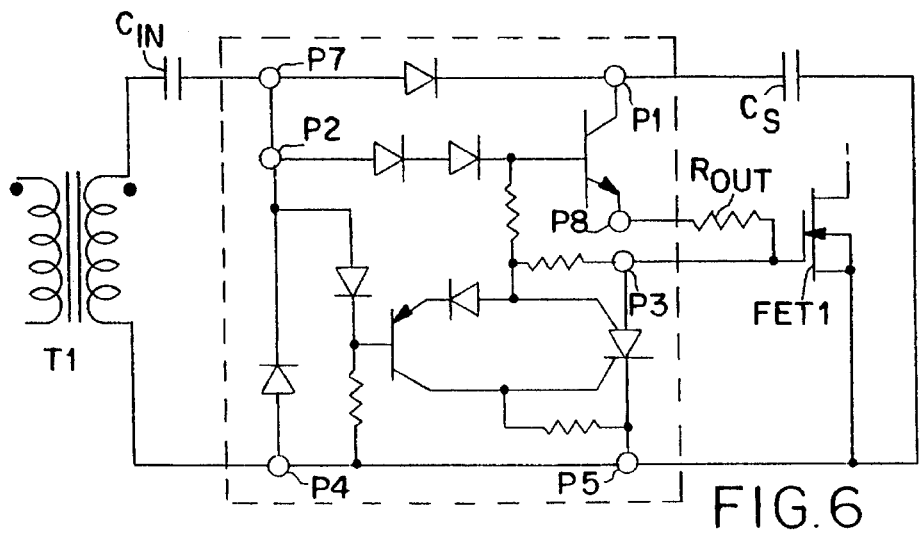
FIG. 6 is a schematic circuit diagram of an embodiment of the present invention with a pulse transformer as the control circuit.

FIG. 6 is but one example of the use of the power driver circuit of FIG. 4. Other variations may include smaller diodes connected in parallel with diodes D1 and D5 external to the integrated circuit of the driver. These diodes reduce the recovery time for input currents above 100 mA, for example. Similarly, circuit variations may include elimination of the input capacitor $C_{IN}$ and the storage capacitors $C_s$ and their replacement by appropriate resistors. $R_{OUT}$ would also be eliminated, albeit with decreased turn-on time of the MOSFET.

Figure 7:
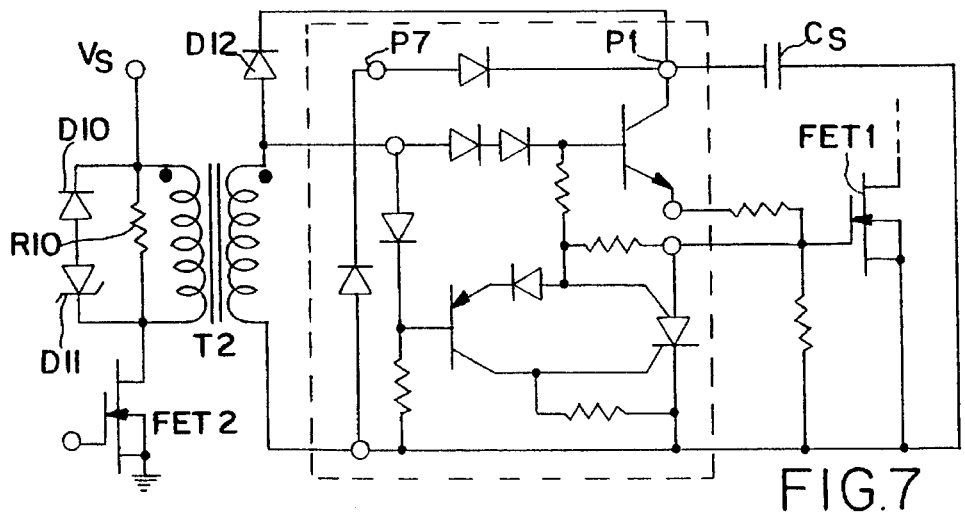
FIG. 7 is a circuit diagram of an embodiment of the present invention with a unipolar transformer as the control circuit.

In high wattage power supply, several MOSFETs may be connected in parallel requiring the use of a unipolar transformer pulse driver for the total gate currents. As illustrated in FIG. 7, the unipolar transformer T2 is controlled by FET 2 and includes diodes D10 and D11 and resistor R10 in parallel with primary of the transformer T2. Zener diode D11 clamps the back swing of the primary which also limits the back swing in the secondary. The resistor R10 continues to pass the core of demagnetizing current after the reverse voltage drops below the zener conduction voltage. Because of the clamping operation of the zener diode D11, the clamping diodes D1 and D5 of the driver are not needed and pin P7 may be left open. The external diode D2 which connects the secondary of the transformer T2 to pin P1, charges the storage capacitor $C_s$. The controller input P2 is also connected to the secondary transformer T2 and the diodes D2, D3, D11 must be capable of sustaining the back swings voltage of the transformer. As an alternative, the diode D12 may connect the output of the secondary transformer T2 to both the power input pin P7 and the control input pin P2. Thus, diode D12 prevents the driver circuit from clamping the reverse voltage at one diode drop.

Figure 8:
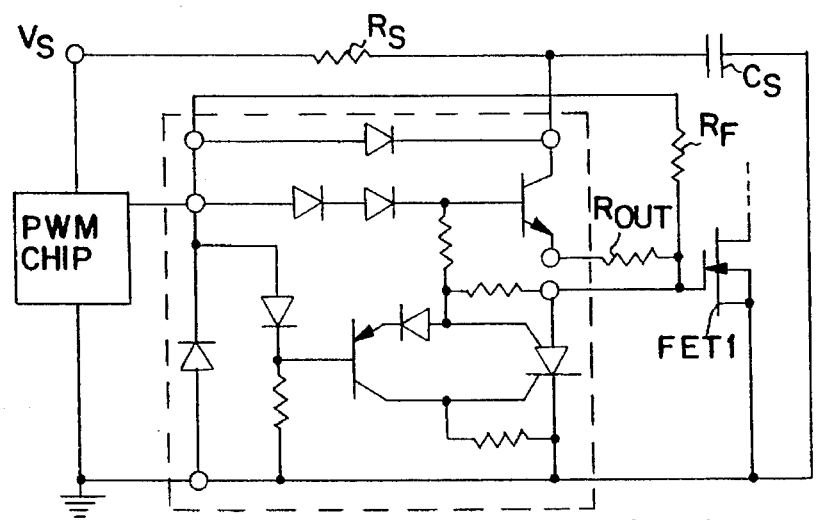
FIG. 8 is a circuit diagram of an embodiment of the present invention with a PWM current booster as the control circuit.

The driver of FIG. 4 will interface to most PWM chips providing greater gate drive capacity than the PWM chip alone. As illustrated in FIG. 8, the driver circuit supply $V_s$ is the same as that for the PWM circuit. The resistor $R_f$ provides a low impedance gate discharge path once the SCR1 has turned off. The resistor $R_s$, along with capacitor $C_s$ provides filtering to reduce switching spikes on the supply line. It also prevents the driver circuit from collapsing the PWM supply should it be set into a latch state. The capacitor $C_s$ should hold about 10 times the charge as the MOSFET gate of FET1.

The power driver circuit of the present invention has been implemented in an integrated circuit in a minimal amount of space. The integrated circuit was built in a high frequency complimentary bipolar process having dielectric isolation. The output transistor Q1 was designed to be capable of at least 2 amps without saturation and with its interconnect required about 1900 mils$^2$.

Figure 9:
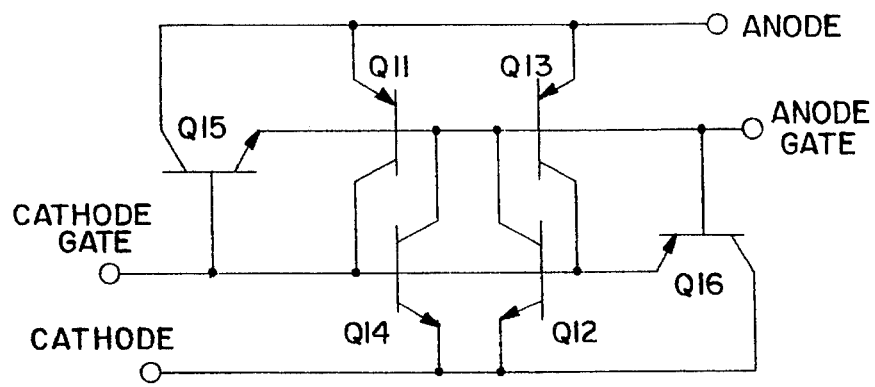
FIG. 9 is a schematic circuit diagram of a latching switch of the prior art that may be used in the circuit of the present invention.

An SCR which may find application in the present invention and is capable of fast turn on and fast turn off is illustrated in FIG. 9. The SCR has a 25 volt blocking voltage, can handle over 10 amps, can turn on in under 10 nanoseconds and takes up approximately 300 mils$^2$. The SCR includes high speed, high gain vertical PNP transistor Q11 and NPN transistor Q12 connected in SCR arrangement with their bases and collectors connected together, with the emitter of Q11 being the anode and emitter of Q12 being the cathode. Connected in parallel between their emitters, collectors and bases respectively of vertical transistors Q11 and Q12 are slower, low gain lateral PNP transistor Q13 and NPN transistor Q14. A trigger current first turns on the vertical devices Q11 and Q12 which drives the lateral devices Q13 and Q14. The forward voltages at turn-on creates an electric field that aids moving excess charge into the device interior. Thus, the SCR turns on quickly.

To turn off the SCR, two more lateral transistors, namely NPN transistor Q15 and PNP transistor Q16, operate to short out the anode gate-anode junction and the cathode gate-cathode junction when the SCR is on. The collector-emitter path of Q15 connects the anode and anode gate and its base and is controlled with the cathode gate or collector of Q11. The collector-emitter path of Q16 connects the cathode and cathode gate and its base and is controlled by the anode gate or collector of Q12. Transistor Q15 conducts a large fraction of the electrons injected by Q12 and Q14 to the anode terminal reducing the base drive to Q11 and Q13. This limits the charge stored in the bases of Q11 and Q13. Transistor Q6 similarly shunts the hole current to the cathode.

The SCR structure including transistors Q11, Q12, Q13, Q14 and described in detail U.S. Pat. No. 4,979,011 which is incorporated herein by reference. The fast recovery SCR including transistors Q11, Q12, Q15 and Q16 by themselves and in combination with the fast turn on portions Q13 and Q14 are described in U.S. Pat. No. 5,086,242 also incorporated herein by reference.

Figure 10:
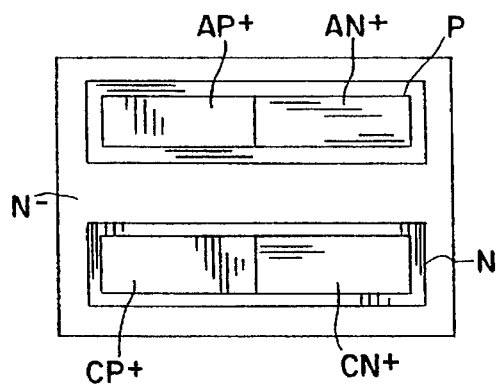
FIG. 10 is a plan view of a diode structure that may be used in the circuit of the present invention.

The diodes D1 through D5 of the circuit of FIG. 4 may limit the speed of the circuit. An improved diode of sufficient speed and breakdown capacity is illustrated in FIG. 10. The anode region AP is formed by a P-type region and a cathode region CN is formed by a N-type region, both in an illustrated N-substrate. The anode contact includes a P+ portion AP+, and an N+ portion AN+. Similarly the cathode contact includes a P+ portion CP+, and an N+ portion CN+. The contact regions have common boundaries.

The diode of FIG. 10 has less charge storage for a given current because the addition of the opposite type diffusion in the anode and cathode contacts. The N+ contact diffusion AN+ in the P anode AP increases the electron diffusion current density in the AP material for a given concentration in the N region. The diode behaves like it has very shallow contact diffusions except that the diode breakdown voltage is not reduced.

The diode forward voltage is higher because of the reduction in carrier concentration in the N-region. But since both holes and electrons contribute to the terminal current, the voltage drop does not increase proportionally to the decrease in carrier concentration. Also, the effective junction barrier potential is reduced by the presence of the "opposite" type diffusion in the contacts which reduces the forward voltage at low current densities and partially compensates at high currents.

Figure 11:
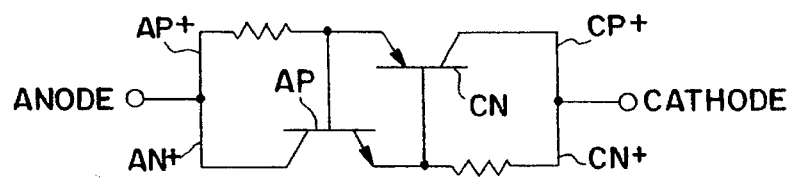
FIG. 11 is circuit diagram of the diode illustrated in FIG. 10.

A circuit model diode of FIG. 10 is a parallel combination of a diode connected PNP with a diode connected NPN as illustrated in FIG. 11. The resistor shown arise from the reduced contact diffusion area since approximately half of the contact is opposite doping type. The resistance may be minimized by a high level interdigitation of the N-type and P-type material for the contact.

Figure 13:
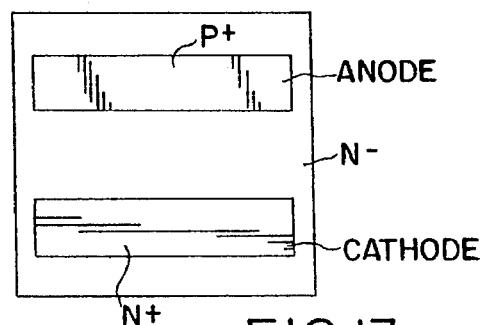
FIG. 13 is plan view of a diode structure of the prior art.
Figure 12:
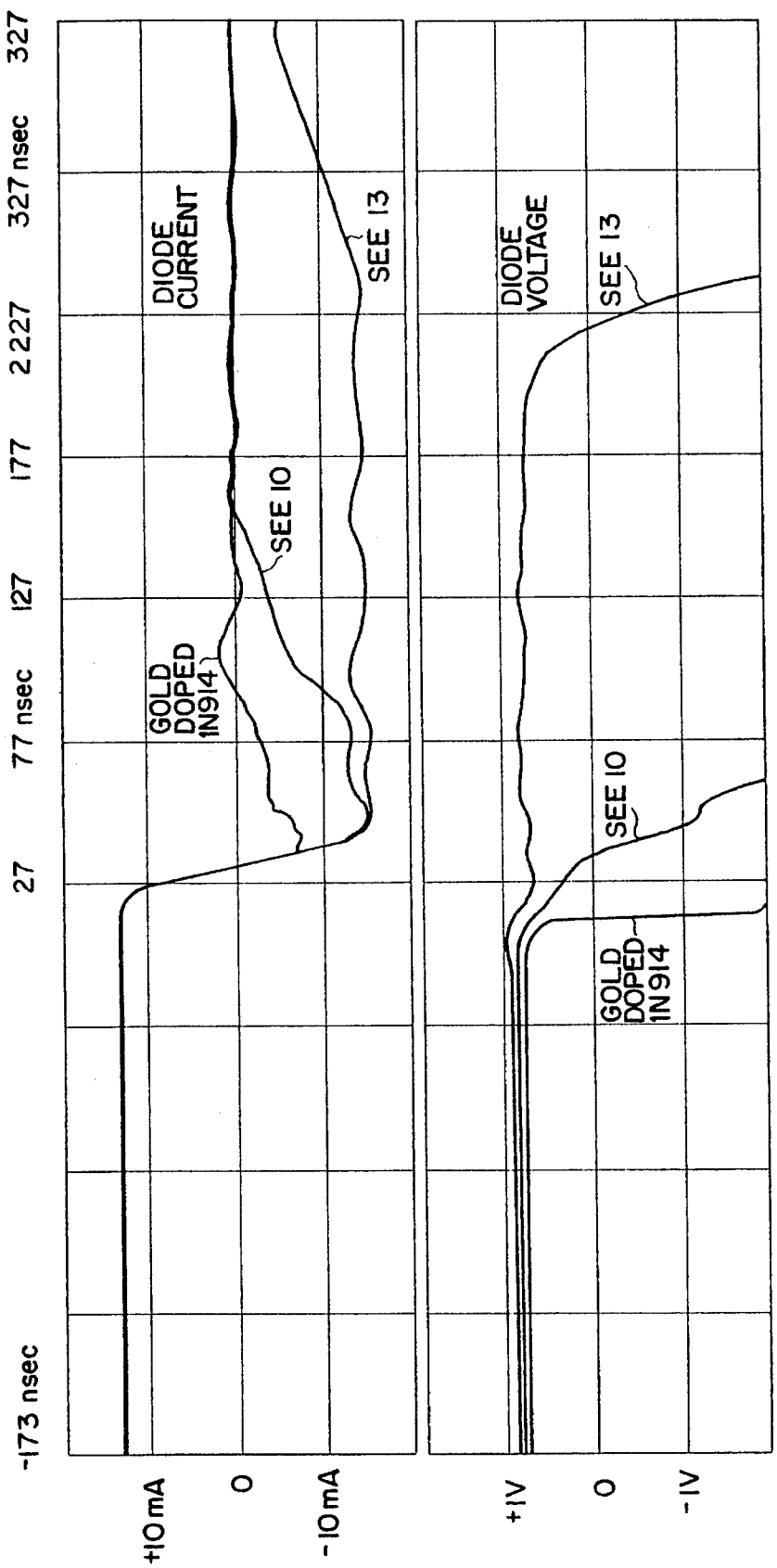
FIG. 12 is a graph depicting current and voltage of diodes that may be used in the present invention.

FIG. 12 shows the voltage and current characteristics of the a typical prior art diode that has not been gold doped (as depicted in FIG. 13), a diode of FIGS. 10 and 11 and a gold doped diode (an 1N914 diode) A pulse generator through a series resistor applied a forward bias followed by a reverse bias. The diode recovery times are illustrated in the graph of FIG. 12. Stored charge is the integral of the reverse current over time. The time the current remains negative is the diode recovery time. The diode of FIGS. 10 and 11, although not as fast as the gold doped diode 1N914 (and not as expensive), has a substantially faster recovery time than that of the prior art diode of FIG. 13, and thus has much less reverse charge.

Figure 14:
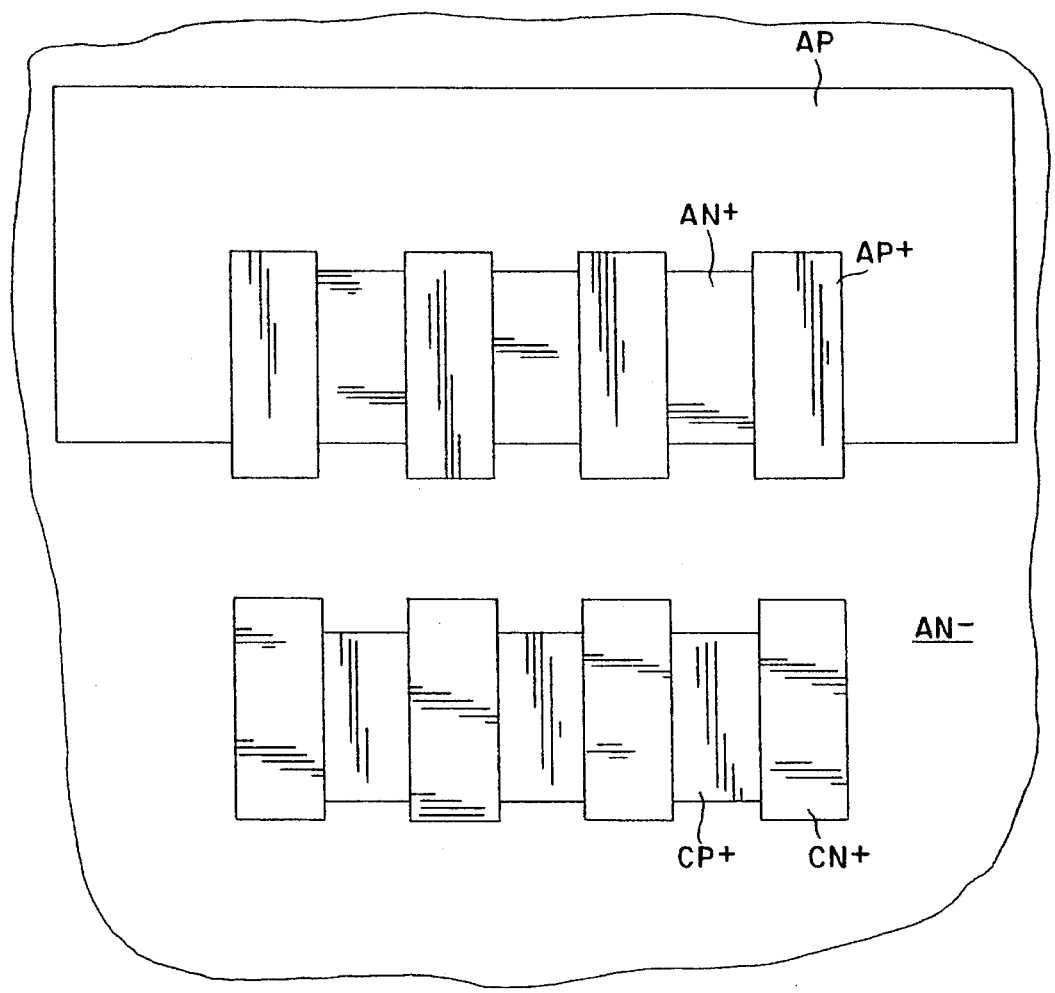
FIG. 14 is further embodiment of the diode illustrated in FIG. 10 that may be used in the circuit of the present invention.

With further reference to FIGS. 10 and 11, the N-substrate region may be the substrate or collector region of a vertical bipolar transistor in the same integrated circuit. The P anode AP and the N cathode CN are the base regions of vertical bipolar transistors and the anode and cathode contact regions AP+, NP+, CP+ and CN+ are the emitter regions of bipolar transistors. The diodes may also be formed using lateral bipolar transistor regions as illustrated in FIG. 14. The P anode AP is a collector of a lateral bipolar transistor. The cathode CN- is the N-substrate. The anode contacts are interdigitized AN+ and AP+ regions. The cathode contacts are interdigitized CN+ and CP+. Although FIGS. 10 and 11 show a single pair of contacts for the anode and cathode, the interdigitized structure of FIG. 14 can also be used in the diode of FIGS. 10 and 11. For the larger capacity diodes, for examples diodes D1 and D5 of FIG. 4, a plurality of cathode regions may be connected in parallel and interdigitized with a plurality of parallel connected anode regions.

Figure 15:
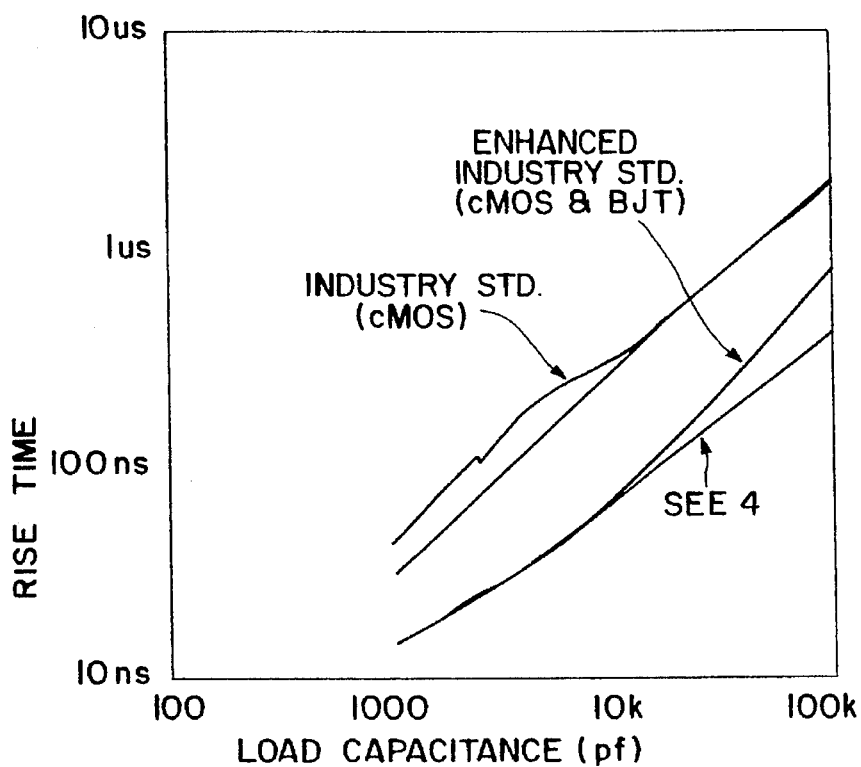
FIG. 15 is a graph depicting the rise times versus load capacitance for the circuit of the present invention and for circuits of the prior art.
Figure 16:
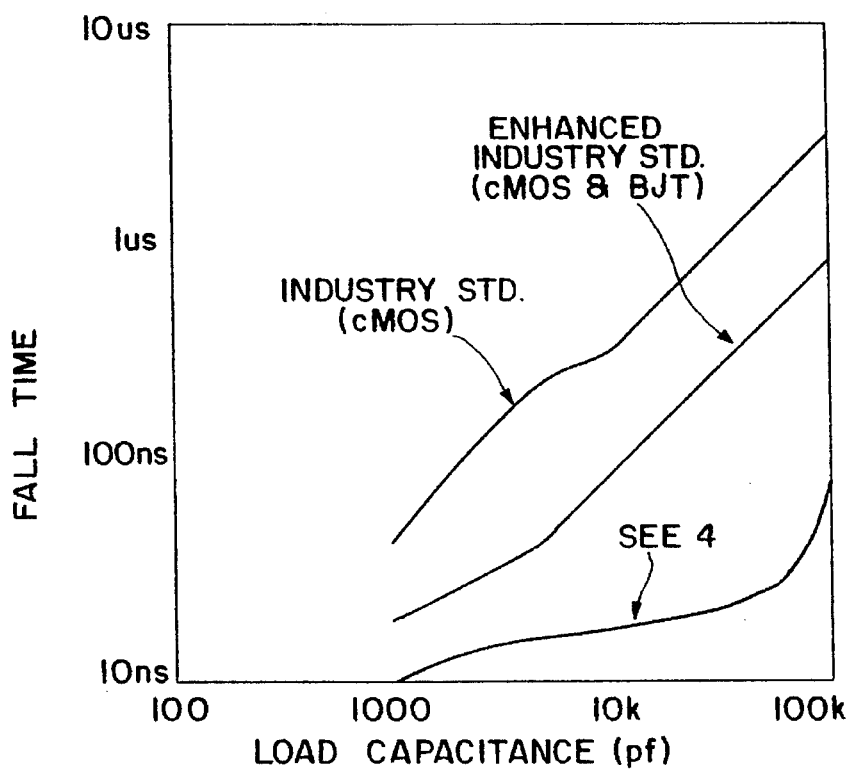
FIG. 16 is a graph depicting the fall times versus load capacitance for the circuit of the present invention and for circuits of the prior art.

To measure the characteristics of the power driver circuit of the present invention, tests were performed to compare it to industry standard power driver circuits that include combined CMOS and bipolar transistors. A 50 ohm pulse generator was connected to the input and a capacitor was fixed to the output. The propagation delay from the input to the output was measured at 10 nanoseconds for the driver of FIG. 4. The output rise and fall times for a range of load capacitances are shown in FIGS. 15 and 16, respectively. These figures show data for the 10% to 90% transition times when the capacitors are charged to 15 volts. The 80 nanoseconds fall time for a 100 nF load indicates that the peak SCR current is in excess of 15 amperes.

The use of the power driver circuit of the present invention in the foregoing are but examples of its many uses, with other implementations being apparent to those skilled in the art. For example, the driver circuit of FIG. 4 could be used to drive IGBT's, power NPN's and GTO-SCR's in applications similar to those shown since a "low" applied to their gates (bases) does not result in a DC current through the SCR. The NPN may be used as a buffer or switch element. Loads could be connected to either the collector or emitter as long as the current, voltage and power dissipation limits are observed.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. A power driver circuit for a semiconductor switching device comprising:
    an SCR that discharges a gate of the semiconductor switching device, the SCR having anode and cathode gates; and
    trigger means operatively connected to said SCR for providing a trigger current to both said anode and cathode gates, thereby increasing the speed at which the SCR turns on, said trigger means comprising means for drawing said trigger current from the gate of the semiconductor switching device.

2. The circuit of claim 1 further comprising transistor means for providing the trigger current to said anode and cathode gates when the polarity of a control signal for controlling the switching device becomes negative.

3. The circuit of claim 2 wherein said transistor means is an PNP transistor.

4. The circuit of claim 1 wherein the semiconductor switching device is one of a MOSFET, IGBT, MCT, BJT, triac, SCR, GTO thyristor, and SIT.

5. A power driver circuit that is responsive to a transformer that reduces the power required to operate a semiconductor switching device at a specific frequency by decreasing the time required to transition the semiconductor switching device from on to off, the semiconductor switching device having a gate operated by the power driver circuit, the circuit comprising:

an SCR having an anode gate and a cathode gate, the SCR having the capacity to discharge a relatively large current at a gate of a semiconductor switching device to turn the semiconductor switching device off when the SCR is turned on;

means for drawing a relatively small trigger current from the gate of the semiconductor switching device when transformer voltage becomes negative; and means for providing the trigger current to both of the anode and cathode gates to initiate conduction in the SCR, thereby increasing the speed at which the SCR turns on and decreasing the time the semiconductor switching device transitions from on to off.

6. The circuit of claim 5 wherein said SCR comprises:

a vertical PNP transistor connected in parallel to a lateral PNP transistor by their collectors, bases and emitters;

a vertical NPN transistor connected in parallel to a lateral NPN transistor by their collectors, bases and emitters;

said vertical PNP transistor having its collector and base connected respectively to said base and said collector of said lateral NPN transistor;

said lateral PNP transistor having its collector and base connected respectively to said base and said collector of said vertical NPN transistor; and said lateral PNP transistor's base being said anode gate and said lateral NPN transistor's base being said cathode gate.

7. The circuit of claim 6 wherein said SCR further comprises first shunt means for limiting a charge stored in the bases of said lateral PNP transistor and said vertical PNP transistor, and second shunt means for limiting a charge stored in the bases of said lateral NPN transistor and said vertical NPN transistor.

8. The circuit of claim 7 wherein said first shunt means comprises a second lateral NPN transistor, and said second shunt means comprises a second lateral PNP transistor.

9. The circuit of claim 5 wherein said means for drawing a trigger current comprises a diode for preventing inadvertent turn on of said SCR.

10. The circuit of claim 9 wherein said diode comprises a PNP transistor and an NPN transistor where the base of each said transistor is connected to the emitter of the other said transistor, and the emitter of each said transistor is connected to the collector of the other said transistor, and wherein resistance means is provided in each of the emitter-collector connections.

11. The circuit of claim 5 wherein the semiconductor switching device is one of a MOSFET, IGBT, MCT, BJT, triac, SCR, GTO thyristor, and SIT.

12. The circuit of claim 1 wherein said SCR has a blocking voltage of 25 volts, the capacity to carry 10 amps and can become fully conductive in 10 nanoseconds or less.

13. A method of driving a semiconductor switching device comprising the steps of:

(a) providing an SCR with both an anode and cathode gate for discharging a gate of the semiconductor switching device to be driven; and (b) providing a trigger current to both of the anode and cathode gates of the SCR by drawing a trigger current from the gate of the semiconductor switching device, thereby increasing the speed at which the SCR turns on.

14. A method of reducing the power required to operate a semiconductor switching device at a specific frequency by decreasing the time required to transition the semiconductor switching device from on to off, where the semiconductor switching device has a gate operated by a power driver circuit in response to a transformer comprising the steps of:

(a) providing an SCR having an anode gate and a cathode gate for discharging a relatively large current at a gate of the semiconductor switching device to turn the semiconductor switching device off when the SCR is turned on;

(b) drawing a relatively small trigger current from the gate of the semiconductor switching device when the transformer voltage becomes negative; and (c) providing the trigger current to both of the anode and cathode gates to initiate conduction in the SCR, thereby increasing the speed at which the SCR turns on and decreasing the time the semiconductor switching device transitions from on to off.

* * * * *